United States Patent [19]
Langston

[11] Patent Number: 5,503,959
[45] Date of Patent: Apr. 2, 1996

[54] LITHOGRAPHIC TECHNIQUE FOR PATTERNING A SEMICONDUCTOR DEVICE

[75] Inventor: Joseph C. Langston, Santa Clara, Calif.

[73] Assignee: Intel Corporation, Santa Clara, Calif.

[21] Appl. No.: 46,477

[22] Filed: Apr. 13, 1993

Related U.S. Application Data

[63] Continuation of Ser. No. 785,950, Oct. 31, 1991.

[51] Int. Cl.$^6$ ........................................................... G03F 7/20
[52] U.S. Cl. ........................... 430/312; 430/394; 430/396; 430/397; 250/492.2
[58] Field of Search ........................... 430/22, 311, 312, 430/394, 396, 397; 250/492.2

[56] References Cited

U.S. PATENT DOCUMENTS

| | | | |
|---|---|---|---|
| 3,860,461 | 1/1975 | Robinette, Jr. | 148/187 |
| 4,231,811 | 11/1980 | Somekh et al. | 148/1.5 |
| 4,374,911 | 2/1983 | Hartley | 430/5 |
| 4,423,127 | 12/1983 | Fujimara | 430/22 |
| 4,564,584 | 1/1986 | Fredericks et al. | 430/312 |
| 4,591,540 | 5/1986 | Bohlen et al. | 430/22 |
| 4,792,534 | 12/1988 | Tsuji et al. | 437/229 |
| 4,849,313 | 7/1989 | Chapman et al. | 430/5 |
| 4,869,998 | 9/1989 | Eccles | 430/311 |
| 4,869,999 | 9/1989 | Fukuda | 430/311 |
| 4,883,359 | 11/1989 | Ina et al. | 356/401 |
| 4,937,162 | 6/1990 | Goirand et al. | 430/22 |

FOREIGN PATENT DOCUMENTS

| | | | |
|---|---|---|---|
| 1-258419 | 10/1989 | Japan | 430/397 |
| 63295350 | 5/1990 | Japan | |

*Primary Examiner*—Kathleen Duda
*Attorney, Agent, or Firm*—Blakely, Sokoloff, Taylor & Zafman

[57] ABSTRACT

A method of forming a patterned resist layer on a semiconductor substrate is described. The substrate is coated with a resist layer and placed on a substrate stage within a projection printer. The projection printer includes a radiation source that emits a radiation wave having a predetermined wavelength, a lens having a predetermined numerical aperture, and a reticle having an opaque section and a transparent section. The projection printer has a resolution that is a function of the wavelength and the numerical aperture. The resist layer is exposed to a radiation pattern formed at the surface of the resist layer when the radiation wave passes through the reticle. The radiation pattern includes a radiative area lying beneath the transparent section and a substantially radiation-free area lying beneath the opaque section. All dimensions of the radiation pattern at the surface of the resist layer are no less than the resolution. A portion of the substantially radiation-free area prevents a significant amount radiation from reaching a first region in the resist layer during all of the exposure. The first region has a pair of opposite edges. Spaced-apart second regions in the resist layer are exposed by the radiative area during the exposure. A resist pattern is formed where a second region lies immediately adjacent to the first region at an opposite edge and another second region lies immediately adjacent to the first region at the other opposite edge. The opposite edges are formed at different times and the distance between the opposite edges are less than the resolution.

20 Claims, 4 Drawing Sheets

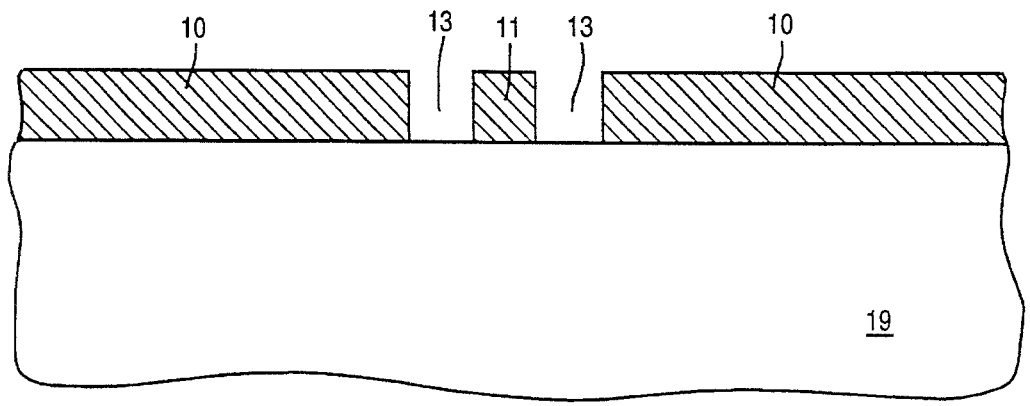
FIG_1A (PRIOR ART)
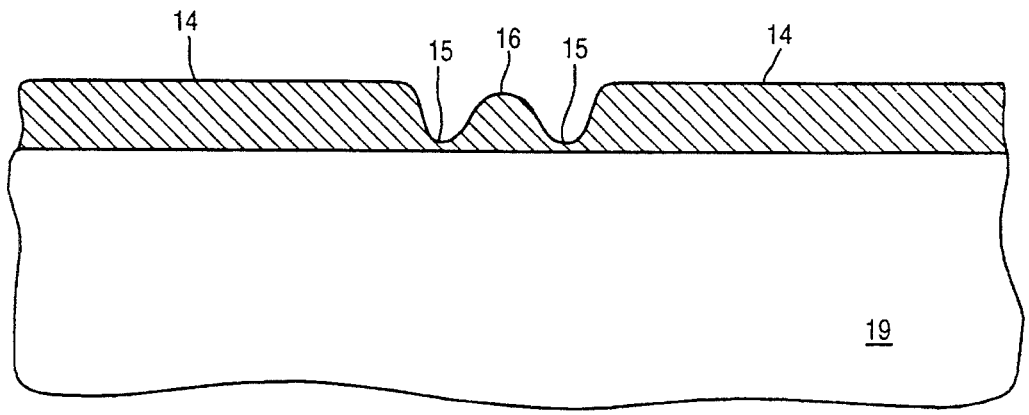
FIG_1B (PRIOR ART)
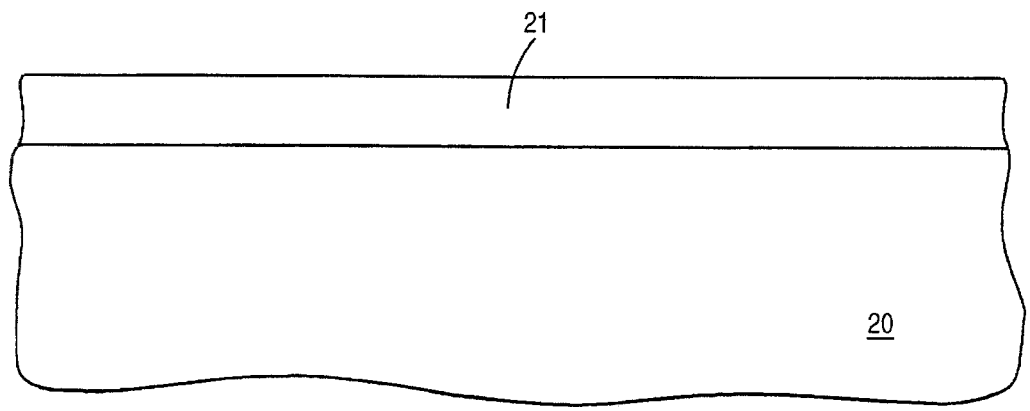
FIG_2

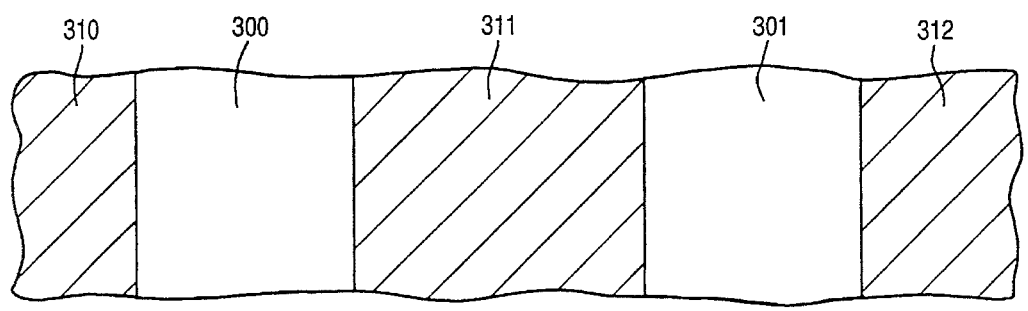
FIG_3A
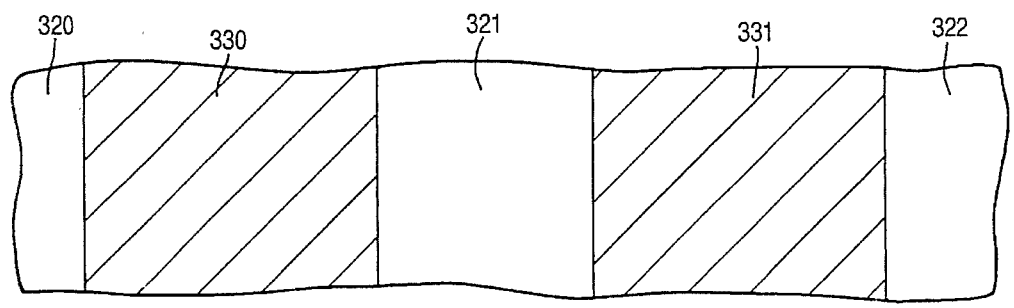
FIG_3B
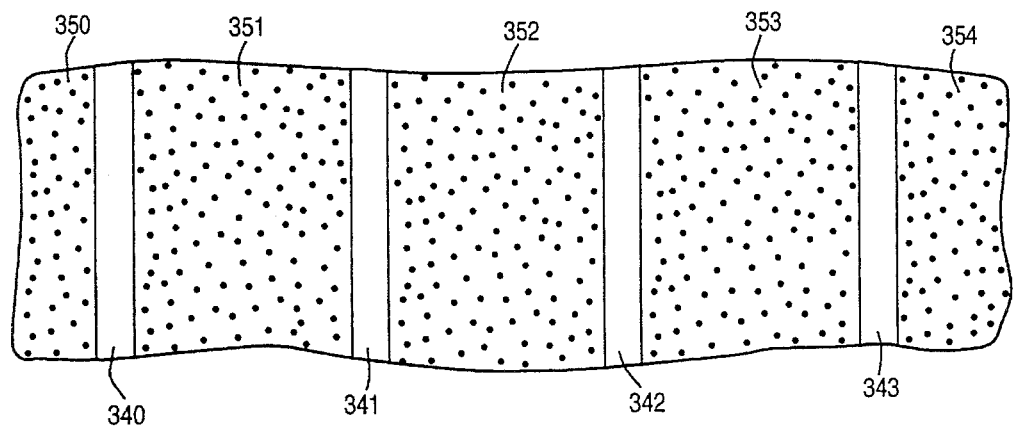
FIG_3C
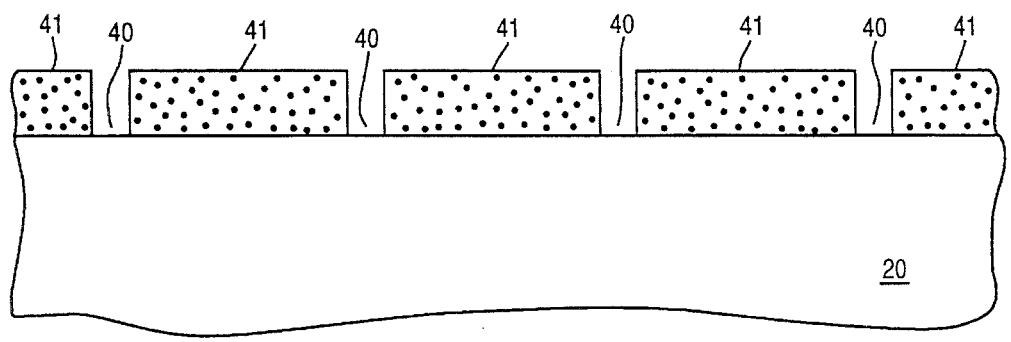
FIG_4

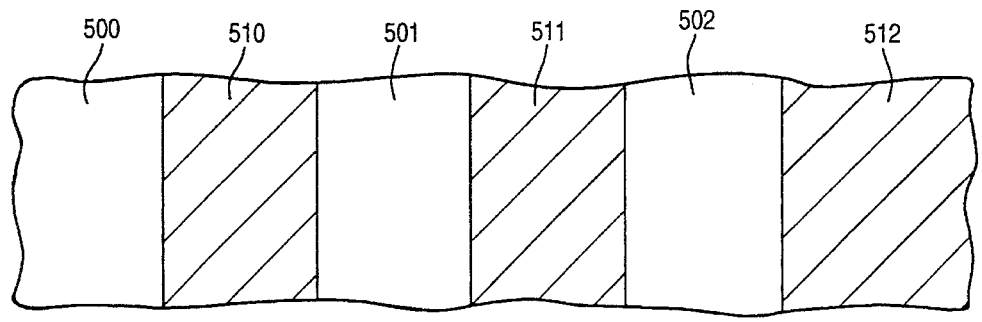
FIG_5A
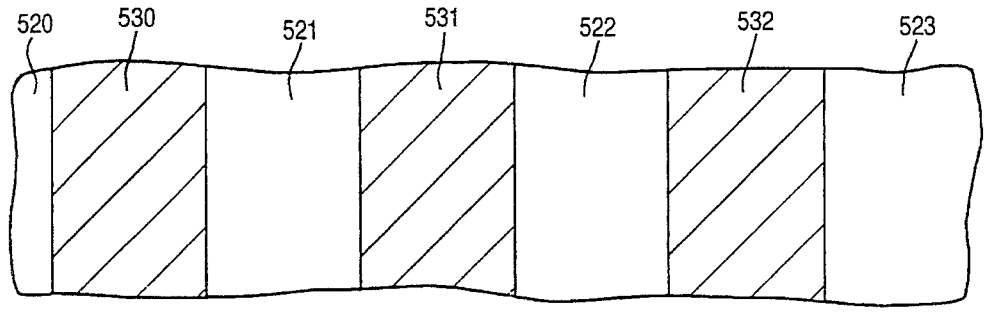
FIG_5B
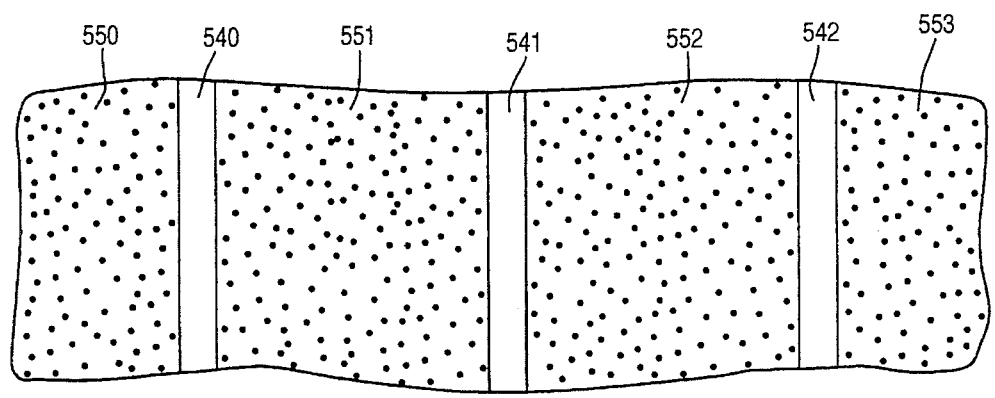
FIG_5C
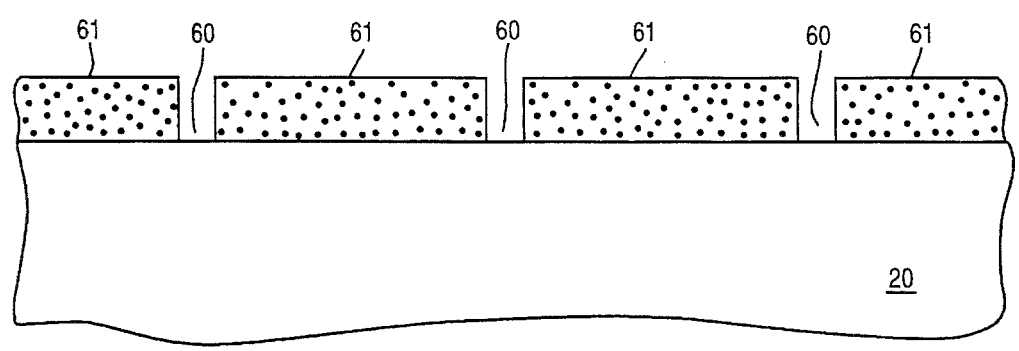
FIG_6

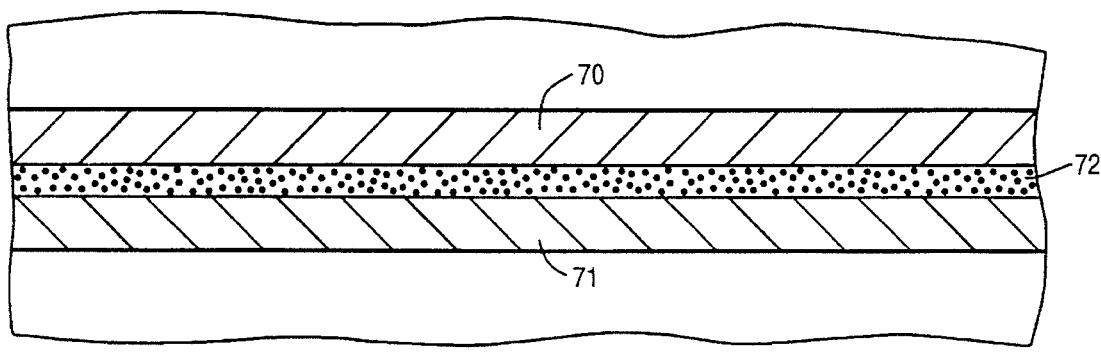
FIG_7A
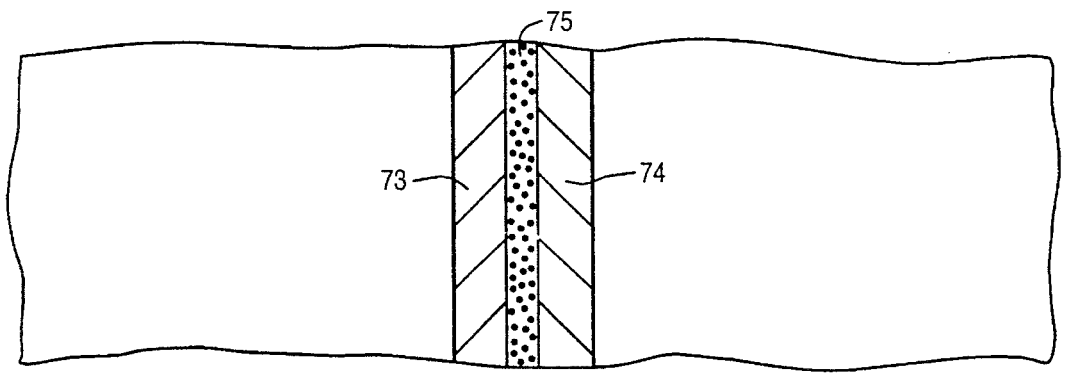
FIG_7B
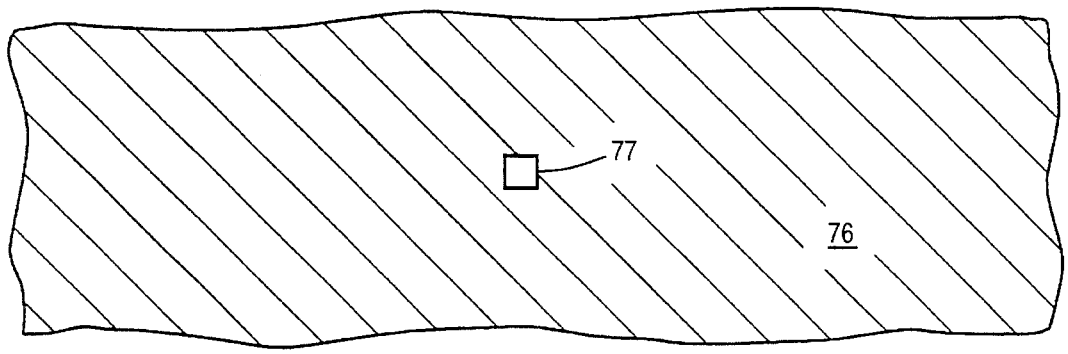
FIG_7C
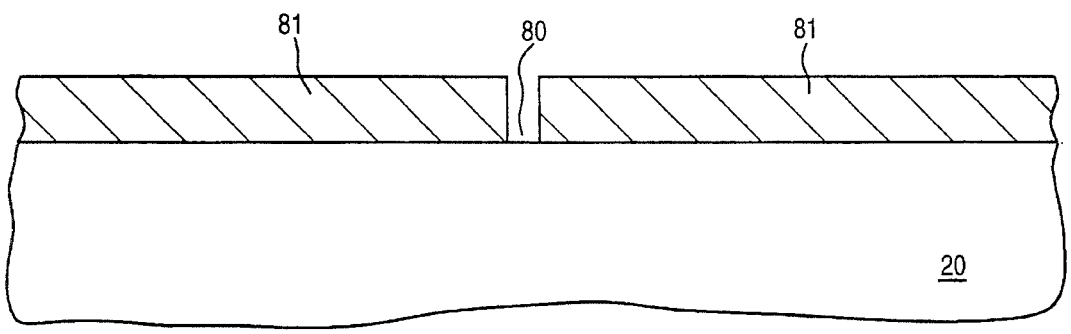
FIG_8

LITHOGRAPHIC TECHNIQUE FOR PATTERNING A SEMICONDUCTOR DEVICE

This is a continuation of application Ser. No. 07/785,950, filed Oct. 31, 1991.

FIELD OF THE INVENTION

The present invention relates generally to the field of forming a patterned resist layer on a semiconductor substrate, and in particular, to the formation of a patterned resist layer on a semiconductor substrate, wherein the patterned resist layer has a dimension less than the resolution.

BACKGROUND OF THE INVENTION

Within the semiconductor industry, projection printers including reticles (also called masks) are used to pattern resist layers. A reticle typically is a glass plate with chrome members on the plate. The chrome members are opaque to a radiation wave having a specific wavelength. The reticle areas without chrome members are substantially transparent to the radiation wave. A discussion of projection printing and diffraction limitations of projection printing appears on pages 274–76 of *VLSI Technology* edited by S. M. Sze (© 1983), which is herein incorporated by reference and hereinafter referred to as Sze.

Within this application, special terminology is used. "Radiation pattern" is being defined as the pattern of radiation formed at the surface of a resist layer when a radiation wave passes through a reticle. Dimensions as used in the application refer to the length and width of a portion of the radiation pattern at the resist layer surface or a portion of the patterned resist layer. Both dimensions are within a plane substantially parallel to the substrate surface (x-y plane) as seen during an aerial view. Thickness is in a vertical direction substantially normal to the substrate surface (z-axis) as seen during a cross-sectional view. Having defined the terminology, the discussion of the prior art continues.

Resolution is a linear measure of how small a radiation pattern dimension can be resolved. Depth of focus is a linear z-axis measure over which a radiation pattern remains in focus. Formulas for calculating resolution and depth of focus appear on page 276 of Sze. When the dimensions of a patterned resist layer are larger than the resolution and the resist layer thickness is thinner than the depth of focus, a substantially ideal resist layer profile as shown in FIG. 1A is formed. The profile includes resist members 10 and 11 that are about the same thickness as the resist layer as originally coated over substrate 19. There is substantially no resist within each opening 13. The corners of the profile are substantially square.

Many prior art methods use a radiation pattern to form the resist layer pattern, such that the pattern and dimensions of both the radiation pattern and the resist layer are substantially the same. When the dimensions are less than the resolution, the patterned resist layer formed by prior art methods is not substantially ideal because of diffraction as disclosed in Japanese Patent Application Number 63-295350 by Okamoto, which is herein incorporated by reference and hereinafter referred to as Okamoto. The light intensity incident of the radiation pattern at the resist layer is similar to the intensity profile that appears in FIG. 18(*d*) of Okamoto. A resist layer profile similar to the one shown in FIG. 1B of this application is formed by the intensity profile of Okamoto's FIG. 18(*d*). The resist layer profile has regions 14 that are substantially the same thickness of the resist layer as coated over substrate 19. Regions 15 are not substantially exposed and have some resist material in locations that are supposed to be openings. Therefore, the regions 15 are not openings and may cause problems during subsequent processing steps. Region 16 receives a significant amount of light and forms a region where the resist thickness is significantly thinner compared to the regions 14. The region 16 may cause problems during subsequent processing steps because the region 16 is expected to have a thickness similar to regions 14. The corners formed within the profile are rounded and are generally not desired.

As can be seen by the resolution and depth of focus equations in Sze, both are affected by changing a wavelength of the radiation wave or the numerical aperture of a lens within the projection printer. Therefore, smaller resolution can be achieved by decreasing the wavelength or increasing the numerical aperture, but the smaller resolution is accompanied by a shallower depth of focus. The shallower depth of focus may require a thinner resist layer and is not generally not desired because of processing complications during subsequent processing steps caused by the thinner resist layer. U.S. Pat. No. 4,869,999 includes a disclosure of a patterning method that uses a plurality of exposures along the optical axis (z-axis) as opposed to the substrate surface (x-y plane).

SUMMARY AND OBJECTS OF THE INVENTION

In view of the foregoing, one object of the present invention is to form a patterned resist layer having a dimension less than the resolution.

It is an additional object of the present invention to form a patterned resist layer without changing the depth of focus, the resist layer thickness, or requiring a plurality of exposures in the z-axis.

It is yet another object of the present invention to form a patterned resist layer that has substantially square corners within the resist layer profile.

A method of forming a patterned resist layer on a semiconductor substrate is described. The substrate is coated with a resist layer and placed on a substrate stage within a projection printer. The projection printer includes a radiation source that emits a radiation wave having a predetermined wavelength, a lens having a predetermined numerical aperture, and a reticle having an opaque section and a transparent section. The lens is disposed between the radiation source and the resist layer, and the reticle is disposed between the radiation source and the lens. The projection printer has a resolution that is a function of the wavelength and the numerical aperture. The resist layer is exposed to a radiation pattern formed at the surface of the resist layer when the radiation wave passes through the reticle. The radiation pattern includes a radiative area lying beneath the transparent section and a substantially radiation-free area lying beneath the opaque section. All dimensions of the radiation pattern at the surface of the resist layer are no less than the resolution. A portion of the substantially radiation-free area prevents a significant amount radiation from reaching a first region in the resist layer during all of the exposure. The first region has a pair of opposite edges. Spaced-apart second regions in the resist layer are exposed by the radiative area during the exposure. A resist pattern is formed where a second region lies immediately adjacent to the first region at an opposite edge and another second region lies immediately adjacent to the first region at the other opposite edge. The opposite edges are formed at different times and the distance between the opposite edges are less than the resolution.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 1A depicts a substantially ideal profile of a resist layer. (Prior art)

FIG. 1B shows a resist layer profile formed by a prior art method. (Prior art)

FIG. 2 illustrates a cross-sectional view of a portion of a semiconductor substrate including a resist layer.

FIG. 3A shows an aerial view of a portion of a radiation pattern including radiative areas and substantially radiation-free areas.

FIG. 3B depicts an aerial view of the radiation pattern in FIG. 3A after the substrate has been moved relative to the radiation pattern in accordance with the currently preferred embodiment of the present invention.

FIG. 3C shows an aerial view of the substrate of FIG. 2 after exposing the resist layer in accordance with the currently preferred embodiment of the present invention.

FIG. 4 illustrates a cross-sectional view of the substrate in FIG. 2 after forming the resist members in accordance with the currently preferred embodiment of the present invention.

FIG. 5A depicts an aerial view of a portion of a radiation pattern including radiative areas and substantially radiation-free areas.

FIG. 5B illustrates an aerial view of the radiation pattern in FIG. 5A after the substrate has been moved relative to the radiation pattern in accordance with an alternate embodiment of the present invention.

FIG. 5C shows an aerial view of the substrate of FIG. 2 after exposing the resist layer in accordance with the alternate embodiment of the present invention.

FIG. 6 depicts a cross-sectional view of the substrate in FIG. 2 after forming the resist members in accordance with the alternate embodiment of the present invention.

FIG. 7A shows an aerial view of a portion of a resist layer overlapping radiation patterns.

FIG. 7B illustrates an aerial view of the radiation pattern in FIG. 7A after the substrate has been moved relative to the radiation pattern in accordance with an alternate embodiment of the present invention. FIG. 7C illustrates an aerial view of substrate of FIG. 2 after exposing the resist layer in accordance with the alternate embodiment of the present invention. FIG. 8 shows a cross-sectional view of the substrate in FIG. 2 after forming an opening within the resist layer of FIG. 2 in accordance with the alternate embodiment of the present invention.

DETAILED DESCRIPTION

In general, the present invention forms a patterned resist layer having a pair of opposite edges or diametrically opposing points that are exposed at different times, wherein the distance between the opposite edges or diametrically opposite points is less than the resolution. A patterned resist layer having a distance between the opposite edges or the diametrically opposite points of about 0.2 gm or less can be formed using a projection printer having a radiation source emitting a radiation wave at a wavelength of aboute 248 nm and a lens with a numerical aperture of about 0.42. Smaller patterns may be formed using radiation sources having a shorter wavelength or a lens with a higher numerical aperture.

As shown in FIG. 2, a semiconductor substrate 20 is coated with a chemically amplified negative resist layer 21 approximately 0.7 µm thick. An example of such a resist material is SNR-248™ available from Shipley Company, Inc. In the currently preferred embodiment, the substrate with the resist layer is placed on a substrate stage within a projection printer. The projection printer includes a krypton-fluoride excimer laser radiation source that emits a radiation wave having a wavelength of about 248 nm (excimer deep ultraviolet radiation), a lens having a numerical aperture of about 0.42, and a reticle having opaque areas having chrome members and transparent areas between chrome members. A lens of the projection printer is disposed between the radiation source and the resist layer, and the reticle is disposed between the radiation source and the lens. When the reticle is exposed to the radiation wave, a radiation pattern at the surface of the resist layer, as shown in FIG. 3A, is formed. The radiation pattern has substantially radiation-free areas 310, 311, and 312 that are each about 1.7 I-tm wide and lie beneath the chrome members and radiative areas 300 and 301 that are each about 1.3 gm wide and lie beneath the transparent areas. The resist layer is exposed a first time using the radiation pattern. The regions of the resist layer lying beneath the radiative areas during the first exposure receive a radiation dose of about 20 mJ/cm².

The substrate is moved about 1.5 I. tm to the right. After the stage movement, the resist layer is exposed a second time using the radiation pattern as shown in FIG. 3B. FIG. 3B is the same radiation pattern as depicted in FIG. 3A. FIG. 3B illustrates the change in the radiation pattern position relative to the resist layer shown in FIG. 3C. The radiation pattern has substantially radiation-free areas 330 and 331 that are each about 1.7 gm wide and lie beneath the chrome members and radiative areas 320, 321, and 322 that are each about 1.3 µm wide and lie beneath the transparent areas. The second exposure exposes part of the resist layer that was not exposed during the first exposure. The regions of the resist layer lying beneath the radiative areas during the second exposure receive a radiation dose of about 20 mJ/cm². Any part of the resist layer that is exposed during the first exposure or the second exposure forms an exposed region within the resist layer. FIGS. 3A, 3B, and 3C show the relative radiation pattern positioning for both exposures (FIGS. 3A and 3B) with respect to the resist layer (FIG. 3C).

The exposing sequence forms a patterned resist layer having opposite edges of a substantially unexposed region that are formed at different times. The right-hand edge of substantially radiation-free area 310 of FIG. 3A forms the right-hand edge of substantially radiation-free region 340 in FIG. 3C. The left-hand edge of the substantially radiation-free area 330 in FIG. 3B forms the left-hand edge of substantially unexposed region 340 in FIG. 3C. Substantially unexposed regions 341, 342, and 343 have opposite edges formed in a similar manner. Exposed regions 350, 351, 352, 353, and 354 are formed adjacent to the substantially unexposed regions. The substrate including the patterned resist layer is removed from the projection printer, baked, and developed using well known methods to give a resist layer profile as shown in FIG. 4. The resist members 41 are each about 1.3 µm wide and are separated by about 0.2 μm wide openings 40. The corners of the resist layer profile are substantially square as illustrated in FIG. 4.

Using the optical parameters as previously described, the resolution as predicted by the formula on page 276 Sze is about 0.3 μm. The radiation pattern has dimensions that are about 1.7 μm wide for the substantially radiation-free areas and about 1.3 μm wide for the radiation areas. The radiation pattern dimensions are no less than the resolution, and therefore, the radiation patterns are not distorted by diffraction. The radiation patterns are used to pattern the resist layer including openings 40 about 0.2 μm wide which is less than the resolution. The resist layer profile has substantially squared corners because the profile is not distorted by diffraction.

In an alternate embodiment, the substrate 20 is coated with the resist layer 21 as shown in FIG. 2 and described above. The substrate is placed on the substrate stage within the projection printer having the previously described radiation source and lens. The lens of the projection printer is disposed between the radiation source and the resist layer, and a reticle is disposed between the radiation source and the lens. When the reticle is exposed to the radiation wave, a radiation pattern at the surface of the resist layer, as shown in FIG. 5A, is formed. The radiation pattern has substantially radiation-free areas 510, 511, and 512 that are each about 1.0 μm wide and lie beneath the chrome members and radiative areas 500, 501, and 502 that are each about 1.0 μm wide and lie beneath the transparent areas. The resist layer is exposed a first time using the radiation pattern. The regions of the resist layer lying beneath the radiative areas during the first exposure receive a radiation dose of about 20 mJ/cm$^2$.

The substrate is moved about 0.8 μm to the right. After the stage movement, the resist layer is exposed a second time using the radiation pattern as shown in FIG. 5B. FIG. 5B is the same radiation pattern as depicted in FIG. 5A. FIG. FIG. 5B illustrates the change in the radiation pattern position relative to the resist layer shown in FIG. 5C. The radiation pattern has substantially radiation-free areas 530, 531, and 532 that are each about 1.0 μm wide and lie beneath the chrome members and radiative areas 520, 521, 522, and 523 that are each about 1.0 μm wide and lie beneath the transparent areas. The regions of the resist layer lying beneath the radiative areas during the second exposure receive a radiation dose of about 20 mJ/cm$^2$. Any part of the resist layer that is exposed during the first exposure or the second exposure forms an exposed region within the resist layer. FIGS. 5A, 5B, and 5C show the relative radiation pattern positioning for both exposures (FIGS. 5A and 5B) with respect to the resist layer (FIG. 5C).

The exposing sequence forms a patterned resist layer having opposite edges of a substantially unexposed region that are formed at different times. The left-hand edge of substantially radiation-free area 510 of FIG. 5A forms the left-hand edge of substantially radiation-free region 540 in FIG. 5C. The fight-hand edge of the substantially radiation-free area 530 in FIG. 5B forms the right-hand edge of substantially unexposed region 540 in FIG. 5C. Substantially unexposed regions 541, and 542 have opposite edges formed in a similar manner. Exposed regions 550, 551, 552, and 553 are formed adjacent to the substantially unexposed regions. The substrate including the patterned resist layer is removed from the projection printer, baked, and developed using well known methods to give a resist layer profile as shown in FIG. 6. The resist members 61 are each about 1.8 μm wide and are separated by about 0.2 μm wide openings 60. The corners of the resist layer profile are substantially square as illustrated in FIG. 6. The radiation pattern dimensions are not less than the resolution, but the openings 60 each have a width narrower than the resolution.

In an alternate embodiment, a contact opening may be formed using overlapping radiation patterns. The substrate 20 is coated with the resist layer 21 as shown in FIG. 2 and described above. The substrate is placed on the substrate stage within the projection printer having the previously described radiation source and lens. A reticle having two separate long chrome strips is disposed between the radiation source and the lens. The length of one strip is oriented substantially along the x-axis of the stage, and the length of the other strip is oriented substantially along the y-axis of the stage. The reticle is positioned so that the x-axis strip is over the resist layer. The resist layer 21 is exposed for a first time. Referring to FIG. 7A, the substantially radiation-free area of the radiation pattern for first exposure includes areas 70 and 72. The substrate is moved about 0.4 gm, and the resist layer is exposed a second time to form a substantially radiation-free area for the second exposure including areas 71 and 72. The resist regions being irradiated during either exposure receive a radiation dose of about 20 mJ/cm$^2$. Area 72 is substantially radiation-free during the first two exposures. Area 72 is about 0.2 μm wide.

The reticle is positioned so that the y-axis strip is over the resist layer, so that the strip overlaps pan of area 72. A third exposure forms a third substantially radiation-free area including areas 73 and 75 as shown in FIG. 7B. The substrate is moved about 0.4 μm, and the resist layer is exposed a fourth time to form a fourth substantially radiation-free area including areas 74 and 75. The resist regions being irradiated during the third or fourth exposure receive a radiation dose of about 20 μmJ/cm$^2$. Area 75 is substantially radiation-free during the third and fourth exposures. Area 75 is about 0.2 μm wide. The four exposures form a substantially unexposed region 77 within the resist layer. The region 77 is substantially a square and about 0.2 μm along each side and is surrounded by an exposed region 76 as shown in FIG. 7C. After exposing the resist layer, the substrate receives the developing step and post-exposure bake step as previously described to give the resist layer profile as shown in FIG. 8. An opening 80 about 0.2 μm wide and resist members 81 lie over the substrate 20. The corners of the resist layer profile are substantially square. In an alternative embodiment, the reticle may have one long strip. The first two exposures are similar to the previous first two exposures. The substrate stage is rotated about 90° relative to the reticle, and the resist layer is exposed for a third and fourth time.

Many variations can be made to the previously described embodiments without deviating from the spirit or scope of the present invention. The preceding embodiments describe several different patterns that may be formed using the present invention. The present invention is not limited to patterns described. There is a large number of patterns that may be formed using the present invention including a circular pattern having an edge with diametrically opposite points that are separated by a distance less than the resolution. If a radiation pattern dimension during any instant of time is less than the resolution, the reticle or radiation pattern may need to be changed, so that all radiation pattern dimensions at any instant of time are no less than the resolution.

Other alternative embodiments may use conventional negative photoresist, positive photoresist, and contrast enhanced photoresist in place of or with the chemically amplified negative resist. The present invention may use other materials in conjunction with resist, such as an antireflective coating. The developing and post-exposure baking steps are changed depending on the resist material used, but the developing and post-exposure baking steps are well known within the art.

Any radiation wavelength and a lens having any numerical aperture may be used with the present invention, as long as, all radiation pattern dimensions at any instant of time are no less than the resolution, and the depth of focus is no shallower than the thickness of the resist layer. Many commercially available radiation sources typically produce a radiation wave having a wavelength no greater than about 436 nm. The numerical aperture is typically between about 0.17 and about 0.54 for most commercially available lenses.

The present invention has been described in reference to stage movements. In alternate embodiments, the substrate stage may be fixed and the reticle is moved, or both the reticle and the substrate stage are moved. The present invention may be used with different reticles. For example, FIG. 3A is a radiation pattern from one reticle and FIG. 3B is a different radiation pattern from a different reticle. Both embodiments have pattern errors due to stage movement or reticle alignment. If the pattern errors for an embodiment are no greater than the pattern tolerance, the embodiment can be used. The different reticle method generally takes longer because of the reticle change. One can choose an embodiment that is optimized for one's needs with respect to pattern errors and machine throughput.

In an alternate embodiment, a patterned resist layer having a distance between its opposite edges or diametrically opposite points less than the resolution may be formed during a single continuous exposure when the substrate is in motion relative to the reticle during the exposure. In the case of FIGS. 3A and 3B, the radiation pattern within the FIG. 3A is moved about 1.5 μm to the fight (FIG. 3B) during the single continuous exposure. The radiation dose for all exposed regions of the resist layer is no less than the exposure dose needed to substantially expose the resist material. SNR-248™ needs an exposure dose of about 20 mJ/cm$^2$ to become substantially exposed. The radiation pattern has dimensions that are no less than the resolution. The single continuous exposure forms a patterned resist layer with a distance between its opposite edges or diametrically opposite points less than the resolution.

The benefits of the present invention are realized because opposite edges or diametrically opposite points in the resist layer are formed at different times, yet the radiation pattern used to form the resist pattern are no less than the resolution. Diffraction is not a problem because the radiation pattern dimensions at any instant of time are no less than the resolution. The present invention forms a resist layer profile having substantially square corners because the present invention is not limited by diffraction. The depth of focus is not adversely affected because the wavelength and the numerical aperture do not need changing. Therefore, the thickness of the resist layer does not need to be thinner, and processing complications are avoided. A plurality of exposures in the z- axis are not needed. Sensitivities are also reduced for increased process latitude.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of forming a patterned resist layer on a substrate comprising the steps of:

coating said substrate with an unpatterned resist layer;

exposing a first region of said unpatterned resist layer; and exposing a second region of said unpatterned resist layer, to form said patterned resist layer, wherein said steps of exposing said first region and said second region are performed on a printer having a resolution, wherein said steps of exposing said first region and said second region are performed using at least one reticle, said at least one reticle having a reticle pattern thereon, said reticle pattern being within said resolution, wherein said first region and said second region are positioned to define a third region between said first and said second regions, said third region having a dimension of less than said resolution, and wherein said first region and said second region are exposed with a radiation dose such that said first region and said second region are substantially exposed; and developing said exposed resist layer to substantially remove said exposed resist layer in said first and second regions when said unpatterned resist layer comprises positive resist, and to substantially remove said third region when said unpatterned resist layer comprises negative resist.

2. The method of claim 1 wherein said patterned resist layer is formed using a first exposure for said step of exposing said first region, and a second exposure for said step of exposing said second region.

3. The method of claim 2 wherein a single reticle is used during said first and said second exposures.

4. The method of claim 3 wherein said substrate and said reticle are moved relative to one another between said step of exposing said first region and said step of exposing said second region such that a distance separates said first and said second regions, said distance being less than said resolution.

5. The method of claim 4 wherein said printer exposes said first and second regions with radiation having a wavelength of approximately 436 nm or less, and wherein said printer has a numerical aperture in the range of approximately 0.17–0.54.

6. The method of claim 4 wherein said resist layer comprises negative resist.

7. The method of claim 3 wherein said printer exposes said first and second regions with radiation having a wavelength of approximately 436 nm or less, and wherein said printer has a numerical aperture in the range of approximately 0.17–0.54.

8. The method of claim 2 wherein a first reticle is used for said first exposure, a second reticle is used for said second exposure, said first reticle having a first reticle pattern thereon, said second reticle having a second reticle pattern thereon, said first and said second reticle patterns being within said resolution, wherein said first reticle is aligned to said substrate during said first exposure, and said second reticle is aligned to said substrate during said second exposure such that said first region and said second region have a distance therebetween, said distance being less than said resolution.

9. The method of claim 8 wherein said printer exposes said first and second regions with radiation having a wavelength of approximately 436 nm or less, and wherein said printer has a numerical aperture in the range of approximately 0.17–0.54.

10. The method as described in claim 8 wherein said patterned resist layer comprises a line and space pattern.

11. The method of claim 10 wherein said resist layer comprises negative resist.

12. The method of claim 8 wherein said resist layer comprises negative resist.

13. The method of claim 1 wherein said substrate and said reticle are moved relative to one another between said step of exposing said first region and said step of exposing said second region such that a distance separates said first and said second regions, said distance being less than said resolution.

14. The method as described in claim 13 wherein said patterned resist layer comprises a line and space pattern.

15. The method of claim 14 wherein said resist layer comprises negative resist.

16. The method of claim 13 wherein said resist layer comprises negative resist.

17. The method of claim 1 wherein said printer exposes said first and second regions with radiation having a wavelength of approximately 436 nm or less, and wherein said printer has a numerical aperture in the range of approximately 0.17–0.54.

18. The method as described in claim 1 wherein said patterned resist layer comprises a line and space pattern.

19. The method of claim 18 wherein said resist layer comprises negative resist.

20. The method of claim 1 wherein said resist layer comprises negative resist.

* * * * *